(12) United States Patent
Tian et al.

(10) Patent No.: US 11,282,968 B2
(45) Date of Patent: Mar. 22, 2022

(54) DEVICE STRUCTURE FOR INCREASING COUPLING RATIO OF BODY-TIED FIN STRUCTURE FLASH MEMORY CELL

(71) Applicant: SHANGHAI HUALI INTEGRATED CIRCUIT CORPORATION, Shanghai (CN)

(72) Inventors: Zhi Tian, Shanghai (CN); Juanjuan Li, Shanghai (CN); Hua Shao, Shanghai (CN); Haoyu Chen, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 0 days.

(21) Appl. No.: 16/943,993

(22) Filed: Jul. 30, 2020

(65) Prior Publication Data

US 2021/0305423 A1    Sep. 30, 2021

(30) Foreign Application Priority Data

Mar. 24, 2020 (CN) .......................... 202010213145.5

(51) Int. Cl.
*H01L 29/788* (2006.01)
*H01L 27/088* (2006.01)
*H01L 29/78* (2006.01)

(52) U.S. Cl.
CPC ........ *H01L 29/788* (2013.01); *H01L 27/0886* (2013.01); *H01L 29/7851* (2013.01)

(58) Field of Classification Search
CPC ............... H01L 29/788; H01L 27/0886; H01L 29/7851
See application file for complete search history.

(56) References Cited

U.S. PATENT DOCUMENTS

| | | | |
|---|---|---|---|
| 6,573,137 B1* | 6/2003 | Divakaruni | H01L 27/10864 438/248 |
| 2018/0323200 A1* | 11/2018 | Tang | H01L 27/10805 |
| 2020/0013896 A1* | 1/2020 | Xu | H01L 27/11551 |

* cited by examiner

*Primary Examiner* — Edward Chin
(74) *Attorney, Agent, or Firm* — Alston & Bird LLP

(57) ABSTRACT

The present disclosure provides a device structure for increasing the coupling ratio of a body-tied fin flash memory cell. The device includes a plurality of elongate fin structures arranged in parallel in an active layer on a substrate, a floating gate disposed on the top surface and the opposing sidewalls of each of the fin structures and at a predetermined location on the elongated fin, and dispersed structure. The dispersed structure comprises a plurality of stacked layers parallel to the substrate, spaced evenly apart; and two adjacent fin structures share one dispersed structure at their sidewalls. This device increases the distance between adjacent floating gates, reduces coupling capacitance, and reduces the disturbance between the cells, which is conducive to increasing the drain voltage, improving the programming speed, and further reducing the gate voltage. More optimization options for subsequent shrinking of the flash memory cells can be provided.

9 Claims, 3 Drawing Sheets

DEVICE STRUCTURE FOR INCREASING COUPLING RATIO OF BODY-TIED FIN STRUCTURE FLASH MEMORY CELL

CROSS-REFERENCES TO RELATED APPLICATIONS

This application claims priority to Chinese patent application No. CN202010213145.5, filed on Mar. 24, 2020 at CNIPA, and entitled "DEVICE STRUCTURE FOR INCREASING COUPLING RATIO OF BODY-TIED FIN STRUCTURE FLASH MEMORY CELL", the disclosure of which is incorporated herein by reference in entirety.

TECHNICAL FIELD

The present application relates to the field of semiconductors, in particular to a device structure for increasing a coupling ratio of a body-tied fin structure flash memory cell.

BACKGROUND

Flash memories have been widely used as the optimal choice for non-volatile memory applications from their advantages of high density, low price, and electrical programmability and erase ability. Currently, flash memory cells are mainly implemented on the advanced technology nodes, and an exemplary schematic structural diagram thereof is shown in FIG. 1. To meet the requirements for high-capacity flash memories, total number of chips on each silicon wafer has been reduced for the existing technology nodes. In addition, as more advanced technology nodes mature with time, flash memories are manufactured using the matching advanced technologies. For existing structures employing hot electron programming, corresponding leakage current gradually increases as the channel shortens. In addition, t channel's punch-through voltage cannot meet the higher voltage requirements during gate programming. Eun Suk Cho et al. (E. S. Cho, et al., ESSDERC., p289, 2004) proposed a body-tied fin structure flash memory cell that can maintain the high drain voltage after the channel is shortened. Later, the same group (Eun Suk Cho. et al., VLSI Tech, pp. 208-209, 2005) applied $HfO_2$ material which has a high dielectric constant to improve the coupling ratio between adjacent flash memory cells, at different crystal planes and with various doping concentrations to solve the problems of devices' low programming speed from devices' low coupling ratios, as well as drain disturbance increase caused by the large-area overlap between the device's drains and the gates (see Eun Suk Cho. et al., "Technology Breakthrough of Body-Tied FinFET for sub 50 nm NOR Flash Memory", 2006, Symposium on VLSI Technology Digest of Technical Papers). Some of the reference's figures are shown here as FIGS. 2a-2c. However, the material $HfO_2$ which has a high dielectric constant has a relatively large physical thickness. When the coupling ratio of a flash memory cell increases coupling between adjacent flash memory cells, disturbance of flash memories becomes more severe. In addition, relatively large floating gate areas of a fin structure also increases coupling between flash memory cells. Another problem is that although different crystal planes can improve the programming speed, the disturbance from other flash memory cells cannot be eliminated. A body-tied fin structure with improved programming efficiency may be used as an alternative structure for the future shrinking of flash memory structures, shown in FIGS. 3a and 3b. An example of a transistor in FIG. 3a shows that hot electron distribution within a body-tied fin structure flash memory cell, where a gate, source (S) and drain (D) are built in a base substrate, where the substrate is applied $V_B$ of −0.5V to 1.5V, source is grounded, drain is applied a voltage of $V_D$ of 4V, and the gate has a relative high voltage of $V_G$ at 10V. FIG. 3b refers to an existing FinFET.

BRIEF SUMMARY

The present application discloses a body-tied fin structure in a flash memory cell. According to some embodiments, the flash memory cell includes: an active region disposed on a substrate; a plurality of fin structures each having an elongate shape and disposed on a surface of the active region, wherein the plurality of fin structures are arranged in parallel; and a floating gate comprising a dispersed structure, wherein the dispersed structure is configured to be at a predetermined location along the elongated shape, wherein the dispersed structure is disposed on a top surface and two opposing sidewalls of each of the plurality of fin structures; wherein the dispersed structure further comprises a plurality of stacked layers parallel to the substrate and spaced evenly apart; and wherein two adjacent fin structures of the plurality of fin structures share one dispersed structure.

In some examples, the flash memory cell further comprises a control gate, wherein the control gate is formed on each of the plurality of fin structures at a location spaced away from the floating gate along the elongate shape, wherein a polysilicon layer is sandwiched between said fin structure and the control gate.

In some examples a number of the plurality of fin structures is two.

In some examples, a layer of tunneling silicon oxide is disposed between the floating gate and the fin structure at said sidewalls and the top surface.

In some examples, each of the plurality of stacked layers in the dispersed structure has a same thickness.

In some examples, a spacing between two adjacent stacked layers in the plurality of stacked layers in the dispersed structure equals the thickness of each of the plurality of stacked layers.

In some examples, the dispersed structures of both fin structures have an equal number of evenly spaced stacked layers.

In some examples, the equal number of evenly spaced stacked layers is four.

In some examples, a number of evenly spaced stacked layers in the dispersed structure of one of the two fin structures is different from a number of evenly spaced stacked layers in the dispersed structure of another of the two fin structures; and wherein the evenly spaced stacked layers associated with one of the two fin structures are disposed at locations staggered to the evenly spaced stacked layers associated with another fin structure.

In some examples, the number of evenly spaced stacked layers associated with one fin structure is four, and the number of evenly spaced stacked layers associated with another of the two fin structures is three.

DETAILED DESCRIPTION OF THE DISCLOSURE

Figure 1:
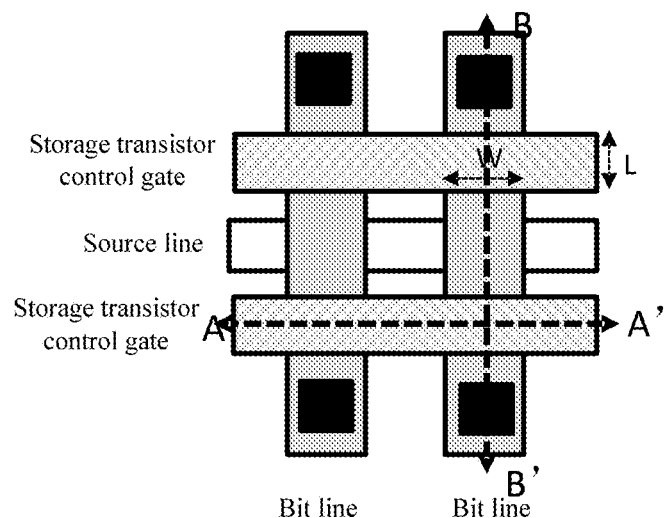
FIG. 1 illustrates a top view of a conventional flash memory cell structure.

The embodiments of the present application are described below by means of specific examples, and those skilled in the art can easily understand other advantages and effects of the present application from the contents disclosed in the description. The present application can also be implemented or applied via other different specific embodiments. Various details in the description can also be modified or changed based on different viewpoints and applications, without departing from the spirit of the present application.

It should be noted that the drawings provided in this embodiment illustrate the basic concept of the present application in a schematic manner only, and only the components related to the present application are shown in the drawings, without being drawn according to the number, shape, and size of the components in actual implementation. The type, number, and scale of each component can be changed at random during the actual implementation, and the component layout type may be more complicated.

Figure 4:
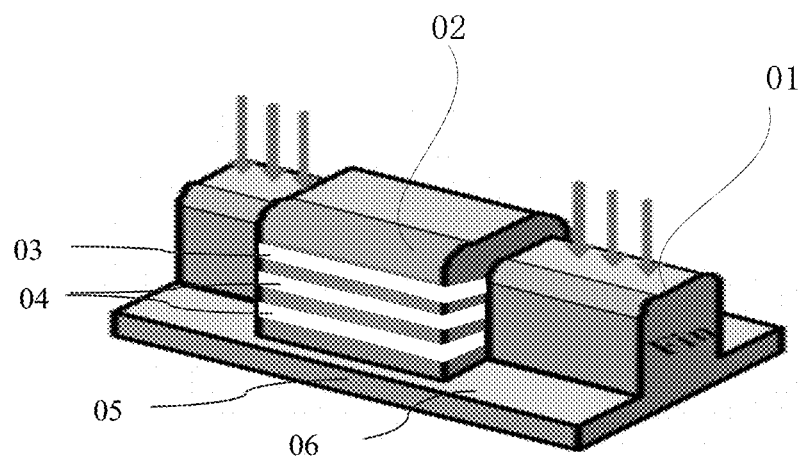
FIG. 4 illustrates the three-dimensional view of a fin structure according to one embodiment of the present disclosure.

The embodiment discloses a body-tied fin flash memory cell structure which increases the coupling ratio of the control gate to the floating gate of the body-tied fin flash memory cell. FIG. 4 illustrates a three-dimensional view of the fin flash memory cell structure. The fin flash memory cell structure includes: an active region 06 on a substrate 05 and a fin structure 01 is placed on the surface of the active region 06. The elongated fin structure 01 includes a plurality of parallel side structures 03 and 04 in its middle section along the elongated length direction thereof. The top of these side structures 03 and other side structures 04 at left and right of the middle section of the fin structure 01 are covered by the floating gate 02. the portion of the floating gate 02 that covers the left and right side structures 04 of the fin structure 01 is a dispersed structure. The dispersed structure consists of a plurality of stacked layers spaced evenly from bottom to top. Respective top structure 03 and side structures 04 of two adjacent fin structures 01 share one dispersed structure.

In the device structure according to the current embodiment, the fin structure (fins) 01 on the active region 06 is also active with doping. FIG. 4 shows that the fin structure 01 disposed on the active region 06 on the substrate 05 is elongated. The d fin flash memory cell structure of the current disclosure includes the fin structures 01 through a floating gate 02 built on an active region 06 on a substrate 05 as shown in FIG. 4. The fin structures 01 are distributed in parallel and spaced from each other. In FIG. 4, the middle section of the elongated fin structure 01 forms a number of parallel and spaced apart top and side structures 03 and 04. These top and side structures 03 and 04 are arranged parallel to the substrate 05 and under the floating gate 02. The top side structure 03 of the fin 01 and side structures 04 of the fin structure 01 including portions of the sidewalls of the fin 01 between the top and side structures 03 and 04 are covered by the floating gate 02. Since the full fin structure 01 is elongated, the portion thereof covered by the floating gate 02 is a portion in the middle section of the fin structure 01 along the fin axial length direction.

Figure 2A:
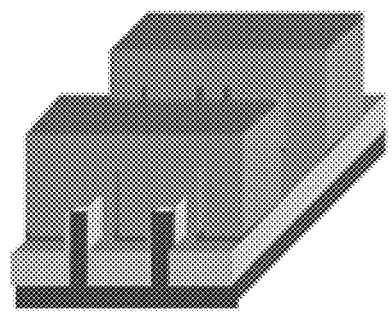
FIG. 2a illustrates a perspective view of the three-dimensional structure of an existing body-tied fin array.
Figure 2B:
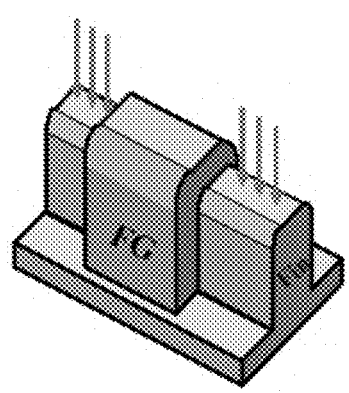
FIG. 2b illustrates a perspective view of the three-dimensional structure of an existing flash memory cell.
Figure 2C:
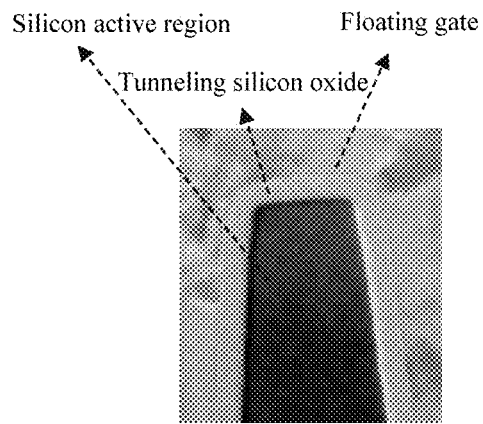
FIG. 2c shows the cross sectional SEM image of a gate area of an existing flash memory cell gate.
Figure 3A:
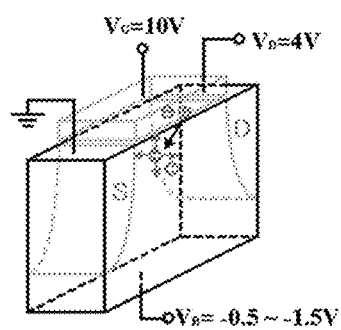
FIG. 3a illustrates the hot electron distribution within a body-tied fin structure flash memory cell.
Figure 3B:
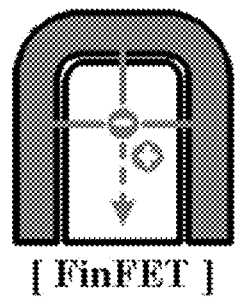
FIG. 3b shows a schematic gate structure of an existing FinFET gate.

Referring to FIG. 4, the floating gate 02 covers the top and side structures 03 and 04 of the fin structure 01 and the left and right sidewalls between them. In the current embodiment, the floating gate 02 covering the left and right sidewalls of the fin structure 01 is a dispersed structure. The dispersed structure is formed by dividing a relatively thick side structure of the entire floating gate 02 (see FIG. 2b) into multiple layers. This is how the division is achieved: the original side structure of the floating gate is fabricated into a plurality of stacked layers in the direction perpendicular to substrate 05. There is a specific desired spacing between each pair of a stacked layer and its adjacent stacked layer thereof. The fin flash memory cell structure includes a plurality of fin structures distributed in parallel to each other, so sidewalls of two adjacent fin structures share one dispersed structure (see FIG. 2a).

In another embodiment of the current disclosure, in addition to the portion covered by the floating gate, the fin structure further includes another portion spaced from the floating gate and covered by polysilicon in the length direction thereof, and said portion forms a control gate (see FIG. 1). The floating gate of the present application includes a polysilicon material. The control gate and the floating gate of the embodiment are spaced by a specific distance and together constitute a storage transistor control gate of the device structure.

In another example of the disclosure, there are two fin structures disposed from the surface of the active region and distributed in parallel. The two fin structures are arranged in parallel to each other. In still another example of the disclosure, a tunneling silicon oxide layer is disposed between the floating gate and the fin structure, in direct contact with the portions of the top surface of the fin structure, the top structure and the left and right side structures of the fin structure are covered by the floating gate. This silicon oxide layer insulates the fin structure from the floating gate.

Figure 5:
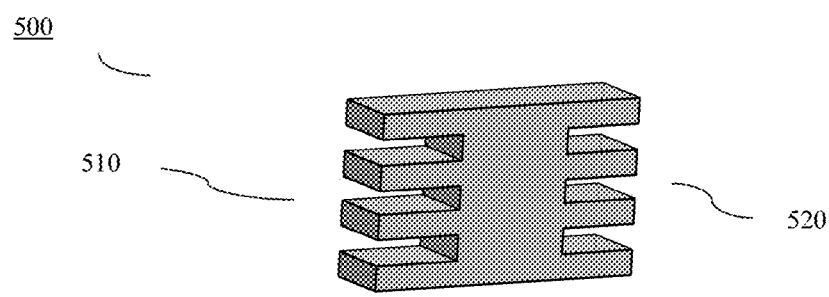
FIG. 5 illustrates the three-dimensional view of the side structure of a floating gate, according to one embodiment of the current disclosure.

In another example of the disclosure, referring to FIGS. 4 and 5, the stacked layers 510 and 520 in the dispersed structure 500 of the floating gate are made with the same thickness, while the thickness here refers to the distance between upper surface and lower surface of each stacked layer. In still another example of the disclosure, a spacing between two adjacent stacked layers in the dispersed structure 500 equals to the thickness of each stacked layer 510 and 520. In two adjacent stacked layers in the dispersed structure 500, the thickness of each stacked layer equals to the spacing between two stacked layers.

In the embodiment of two fin structures disposed in parallel on the active region, the dispersed structure 510 on the left side and the dispersed structure 520 on the right side of one of the two fin structures comprises evenly spaced stacked layers, wherein the number of stacked layers 510 on the left side supporting one fin structure is the same as that of stacked layers 520 on the right side which supports the other fin structure. The numbers of stacked layers in the dispersed structures on two sidewalls of both fin structures are the same. Referring to FIG. 5 as an example, while two fin structures are arranged in parallel, the dispersed structure 500 comprises of four evenly spaced stacked layers on both the left and the right sidewalls, and each of the four stacked layers has the same thickness.

An exemplary case of a dispersion structure shared by multiple fins is shown in FIG. 5, where the number of stacked layers and their thicknesses at the left sidewall and at the right sidewall of the fin structure are the same.

Figure 6:
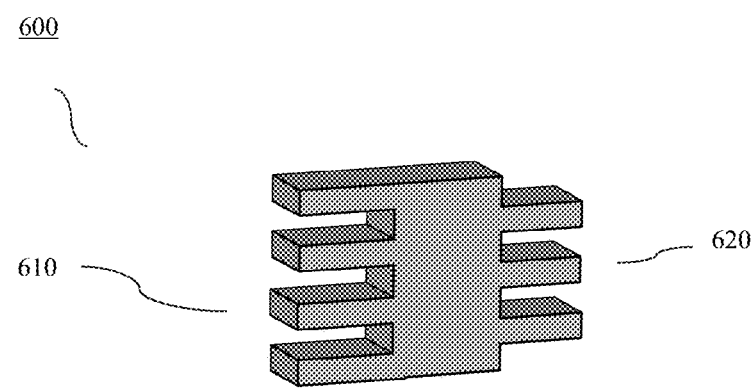
FIG. 6 illustrates another three-dimensional view of the side structure of a floating gate, according to another embodiment of the current disclosure.

According to another embodiment with two parallel fin structures shown in FIG. 6, which illustrates a schematic view of another three-dimensional view of the floating gate structure according to one embodiment of the disclosure. the numbers of stacked layers of the dispersed structure 600 shared by two adjacent fin structures can be different. The stacked layers 610 and 620 do not align to each other across the dispersion structure, instead they stagger in positions.

In the example where there are two parallelly disposed fin structures, the dispersed structure 600 comprises four evenly spaced stacked layers 610 at the sidewall of one fin structure and three evenly spaced stacked layers 620 at the sidewall of the other fin structure. Referring to FIG. 6, the left half of FIG. 6 represents a dispersed structure 610 matching a left sidewall of a fin structure, and the right half represents a dispersed structure 620 matching a right sidewall of the fin structure. In the case there is another adjacent fin structure at the right side of the fin structure (fins not shown here), and the dispersed structure 610 represented by the left half of 600 in FIG. 6 is a dispersed structure away from the another fin structure Thus the dispersed structure 620 shown at the right side is shared by the right sidewall of one fin structure and the left sidewall of the other fin structure. There are four stacked layers in the dispersed structure 610 at the left side in the dispersed structure 600, and there are three stacked layers in the dispersed structure 620 at the right side. The respective positions of the four stacked layers at the left side 610 are staggered with the three stacked layers 620 at the right side.

The number of the stacked layers in a dispersed structure is not limited to those shown in FIG. 5 or FIG. 6 in the above embodiments, and the placing of the stacked layers on the dispersed structure is not limited either. In addition, the thickness of the stacked layers and the spacing distance between the stacked layers are not limited.

In conclusion, the present disclosure describes a fin structure with dispersed side structures, which increases a coupling ratio of the control gate to the floating gate of the body-tied fin flash memory cell. In addition, it reduces noise from adjacent cells. The dispersed fin structure increases the distance between adjacent floating gates, therefore reducing coupling capacitance therebetween, resulting in decreased cross talking between the cells. In addition, the shape of the disperse structure can be adjusted to increase the capacitance between the floating gate and the control gate, thereby increasing the coupling ratio between them. This structure can achieve both a reduction in the cross talking between the flash memory cells, which is conducive to increased drain voltage and improved programming speed, and also an increase in the coupling ratio between the control gate and the floating gate, which is conducive to further reducing the gate voltage. In combination with the high programming efficiency of the body-tied fin structures, more optimization options for subsequent shrinking of the flash memory cells can be provided. Therefore, the present disclosure effectively overcomes various defects occurred in existing technologies, so has high industrial utilization value.

The embodiments described above illustrate the principle and effect of the present application and are not intended to limit the present application. Any person familiar with this technology can modify or change the above embodiments, without departing from the spirit and scope of the present application. Therefore, all equivalent modifications or changes made by those with ordinary knowledge in the technical field without departing from the spirit and technical idea disclosed by the present application shall fall with claims of the present application.

What is claimed is:

1. A flash memory cell with body-tied fins, comprising:
    an active region disposed on a substrate;
    a plurality of fin structures each having an elongate shape and disposed on a surface of the active region, wherein the plurality of fin structures is arranged in parallel; and
    a floating gate comprising a dispersed structure, wherein the dispersed structure is configured to be at a predetermined location along the elongated shape, wherein the dispersed structure is disposed on a top surface and two opposing sidewalls of each of the plurality of fin structures;
    wherein the dispersed structure further comprises a plurality of stacked layers parallel to the substrate and spaced evenly apart;
    wherein two adjacent fin structures of the plurality of fin structures share one dispersed structure;
    wherein a coupling ratio between a control gate and the floating gate is increased in the flash memory cell;
    wherein a number of the plurality of fin structures is at least two;
    wherein a number of evenly spaced stacked layers in the dispersed structure of one of the two fin structures is different from a number of evenly spaced stacked layers in the dispersed structure of another of the two fin structures; and
    wherein the number of evenly spaced stacked layers associated with one fin structure is four, and the number of evenly spaced stacked layers associated with another of the two fin structures is three.

2. The flash memory cell with body-tied fins according to claim 1,
    wherein the control gate is formed on each of the plurality of fin structures at a location spaced away from the floating gate along the elongate shape, wherein a polysilicon layer is sandwiched between said fin structure and the control gate.

3. The flash memory cell with body-tied fins according to claim 1,
    wherein the number of the plurality of fin structures is two.

4. The flash memory cell with body-tied fins according to claim 1,
    wherein a layer of tunneling silicon oxide is disposed between the floating gate and the fin structure at said sidewalls and the top surface.

5. The flash memory cell with body-tied fins according to claim 3, wherein each of the plurality of stacked layers in the dispersed structure has a same thickness.

6. The flash memory cell with body-tied fins according to claim 5, wherein a spacing between two adjacent stacked layers in the plurality of stacked layers in the dispersed structure equals the thickness of each of the plurality of stacked layers.

7. The flash memory cell with body-tied fins according to claim 1,
    wherein the dispersed structure of each of the both fin structures has an equal number of evenly spaced stacked layers.

8. The flash memory cell with body-tied fins according to claim 7, the equal number of evenly spaced stacked layers is four.

9. The flash memory cell with body-tied fins according to claim 6, wherein the evenly spaced stacked layers associated with one of the two fin structures are disposed at locations staggered to the evenly spaced stacked layers associated with another fin structure.

* * * * *